United States Patent
Kotani et al.

(10) Patent No.: US 8,440,376 B2
(45) Date of Patent: May 14, 2013

(54) EXPOSURE DETERMINING METHOD, METHOD OF MANUFACTURING SEMICONDUCTOR DEVICE, AND COMPUTER PROGRAM PRODUCT

(75) Inventors: Toshiya Kotani, Tokyo (JP); Kazuya Fukuhara, Tokyo (JP); Michiya Takimoto, Kanagawa (JP); Hidefumi Mukai, Mie (JP); Soichi Inoue, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 210 days.

(21) Appl. No.: 13/007,238

(22) Filed: Jan. 14, 2011

(65) Prior Publication Data

US 2011/0177458 A1    Jul. 21, 2011

(30) Foreign Application Priority Data

Jan. 15, 2010    (JP) .................. 2010-007507

(51) Int. Cl.
*G03F 9/00*    (2006.01)
*G03C 5/00*    (2006.01)

(52) U.S. Cl.
USPC ............................................. 430/30; 382/144

(58) Field of Classification Search ...... 430/30; 382/144
See application file for complete search history.

(56) References Cited

FOREIGN PATENT DOCUMENTS

| JP | 2003-257819 | 9/2003 |
|---|---|---|
| JP | 2006-292941 | 10/2006 |
| JP | 2007-141949 | 6/2007 |
| JP | 2007-199256 | 8/2007 |
| JP | 2009-139632 | 6/2009 |

*Primary Examiner* — Christopher Young
(74) *Attorney, Agent, or Firm* — Finnegan, Henderson, Farabow, Garrett & Dunner, L.L.P.

(57) ABSTRACT

According to one embodiment, a deviation amount distribution of a two-dimensional shape parameter between a mask pattern formed on a mask and a desired mask pattern is acquired as a mask pattern map. Such that a deviation amount of the two-dimensional shape parameter between a pattern on substrate formed when the mask is subjected to exposure shot to form a pattern on a substrate and a desired pattern on substrate fits within a predetermined range, an exposure is determined for each position in the exposure shot in forming the pattern on substrate based on the mask pattern map.

3 Claims, 7 Drawing Sheets

EXPOSURE DETERMINING METHOD, METHOD OF MANUFACTURING SEMICONDUCTOR DEVICE, AND COMPUTER PROGRAM PRODUCT

CROSS-REFERENCE TO RELATED APPLICATIONS

This application is based upon and claims the benefit of priority from the prior Japanese Patent Application No. 2010-007507, filed on Jan. 15, 2010; the entire contents of which are incorporated herein by reference.

FIELD

Embodiments described herein relate generally to an exposure determining method, a method of manufacturing a semiconductor device, and a computer program product.

BACKGROUND

The progress of semiconductor manufacturing technologies in recent years is extremely remarkable. Semiconductor integrated circuit devices (semiconductor devices) having a minimum processing dimension of 50 nanometer are mass-produced. Such microminiaturization of semiconductor devices is realized by the remarkable progress of a lithography technology using a photomask or the like. For example, in a lithography process, when a pattern dimension of the photomask fluctuates, because dimension accuracy of a resist pattern formed on a substrate is deteriorated, dimensions of patterns formed on the substrate are non-uniform in an exposure shot. Therefore, it is necessary to sufficiently suppress a fluctuation amount (an error) of the pattern dimension of the photomask. However, a mask dimension error of the photomask inevitably occurs in manufacturing of the photomask.

It is demanded to form a desired pattern on substrate even if the pattern dimension of the photomask fluctuates.

DETAILED DESCRIPTION

In general, according to one embodiment, a deviation amount distribution of a two-dimensional shape parameter between a mask pattern formed on a mask and a desired mask pattern is acquired as a mask pattern map. Such that a deviation amount of the two-dimensional shape parameter between a pattern on substrate formed when the mask is subjected to exposure shot to form a pattern on a substrate and a desired pattern on substrate fits within a predetermined range, an exposure is determined for each position in the exposure shot in forming the pattern on substrate based on the mask pattern map.

Exemplary embodiments of an exposure determining method, a method of manufacturing a semiconductor device, and a computer program product will be explained below in detail with reference to the accompanying drawings. The present invention is not limited to the following embodiments.

In a first embodiment, a plane shape (a dimension, size, an area, etc.) of a mask pattern of a mask (a photomask) is acquired by an experiment or a calculation and a pattern shape of a pattern to be formed on a substrate such as a wafer is predicted based on an acquisition result. An exposure map for correcting a deviation amount between the pattern shape of the pattern predicted to be formed on the wafer and a target shape (an exposure correction amount distribution in a shot for correcting an exposure) is created. After the exposure map is created, exposure on the wafer is performed using the created exposure map, whereby a pattern having a desired pattern shape (a two-dimensional shape parameter) is formed on the wafer. In the exposure map, a map of exposures (a distribution of dosages) is specified within an exposure shot such that dimensions of patterns formed on the wafer are uniformalized in an exposure shot.

For example, when a contact hole pattern is formed on the wafer, an exposure of an exposure apparatus is changed in a shot or between shots such that an area of a contact hole transferred onto the wafer by exposure processing is equal to a desired area. In the following explanation, the contact hole pattern is formed on the wafer. However, a pattern formed on the wafer can be a pattern other than the contact hole pattern such as a line pattern.

Figure 1:
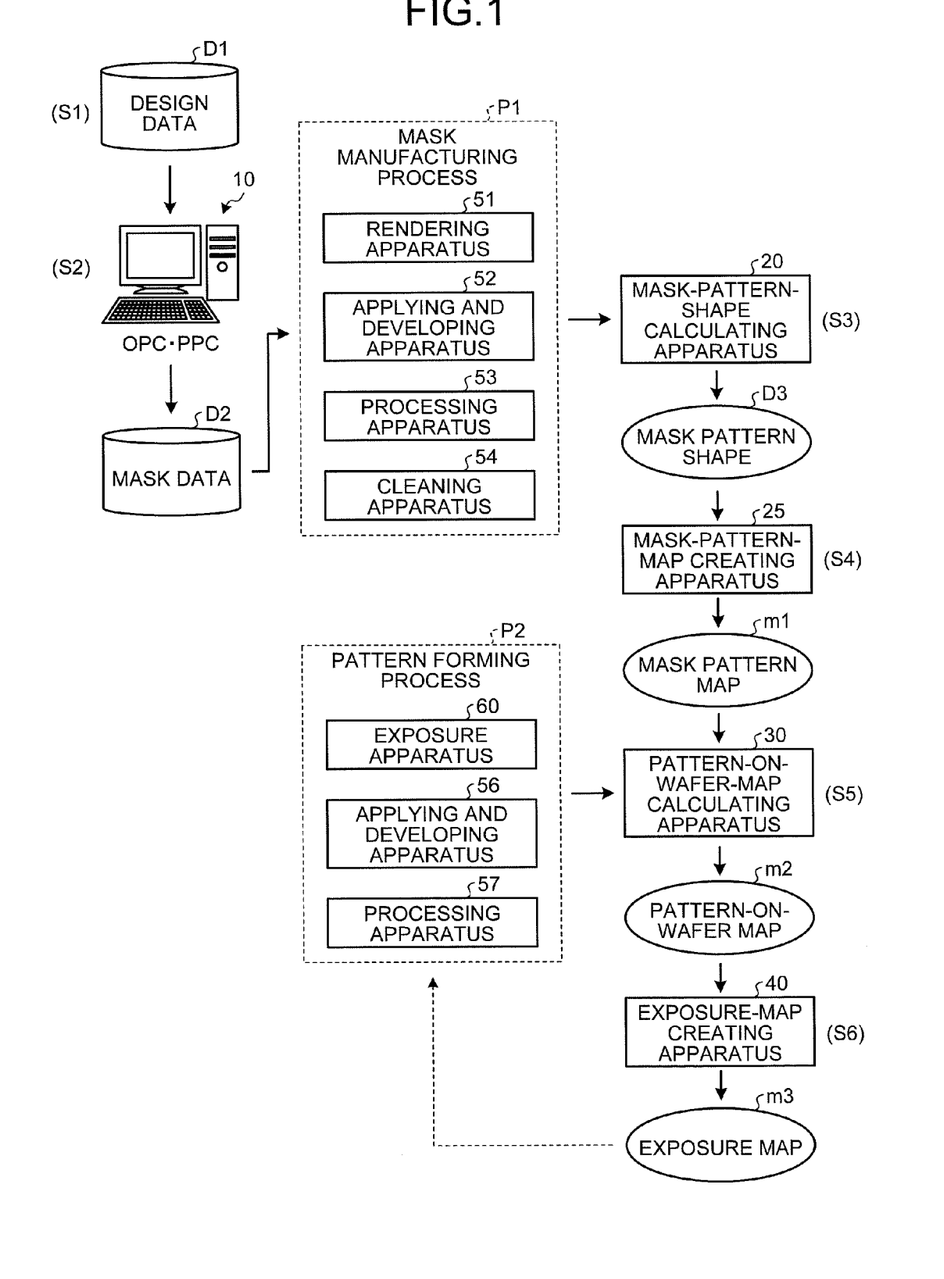
FIG. 1 is a diagram for explaining a concept of an exposure determining method according to a first embodiment.

FIG. 1 is a diagram for explaining a concept of an exposure determining method (an exposure correcting method) according to the embodiment. First, design data D1 of a pattern (a post-etching pattern) to be formed on a wafer is created by a computer such as a design-data creating apparatus (S1).

Thereafter, a lithography target is created using the design data D1. A proximity correction apparatus 10 such as an OPC apparatus or a PPC apparatus creates mask data D2 by applying optical proximity correction (OPC) or process proximity correction (PPC) to the lithography target (S2).

In a mask manufacturing process P1, a mask having a mask pattern corresponding to the mask data D2 is manufactured. In other words, in the mask manufacturing process P1, a mask having a mask pattern formed in a pattern shape substantially the same as a pattern shape of the mask data D2 is manufactured. In the mask manufacturing process P1, a rendering apparatus 51, an applying and developing apparatus 52, a processing apparatus 53, a cleaning apparatus 54, and the like are used.

The rendering apparatus 51 is an apparatus that applies EB rendering to a resist on a mask substrate. The applying and developing apparatus 52 is an apparatus having a function of applying the resist for the EB rendering on the mask substrate before the EB rendering on the mask substrate is performed and a function of developing the resist on the mask after the EB rendering and forming a resist pattern on the mask. The processing apparatus 53 is an apparatus that performs base film processing such as etching from above the resist pattern on the mask and forms a mask pattern such as a contact hole on the mask. The cleaning apparatus 54 is an apparatus that cleans the mask on which the mask pattern is formed. The cleaning apparatus 54 can clean the mask immediately after the mask pattern is formed on the mask or can clean the mask when the mask is stained after exposure processing is performed using the mask.

The mask pattern on the mask manufactured in the mask manufacturing process P1 roughly includes two regions of a light transmitting section and a light blocking section (a semi-transmitting section). The dimension, the peripheral length, the shape, the area, the transmittance, the phase, and the like of the mask pattern are evaluation values that characterize a mask pattern shape. Ideally, it is desirable that a mask having a pattern shape same as the mask data D2 is formed. However, through a process of mask rendering, resist development after the mask rendering, and base film processing with a resist pattern used as a mask material (hereinafter, "mask process"), the evaluation values have a systematic distribution in a mask surface. When the mask having the systematic distribution is exposed with a fixed exposure, the systematic distribution on the mask is directly reflected on a pattern shape on the wafer. As a result, the pattern shape on the wafer changes according to the systematic distribution on the mask of the evaluation values (hereinafter, "evaluation value systematic distribution"). It is likely that deterioration in device characteristics is caused according to the pattern shape change.

Therefore, development of a mask process for minimizing the systematic distribution of the evaluation values on the mask is necessary. However, enormous cost and time are required for the development of the mask process. In this embodiment, an exposure map system that can change an exposure in a shot during exposure on the wafer is used.

To apply exposure to the wafer using the exposure map system, evaluation values on a manufactured mask are calculated by an experiment or a calculation. Specifically, after the mask data D2 is created, a mask pattern shape D3 is derived as shape data of a mask pattern (evaluation values of the mask pattern) formed on the mask.

A mask-pattern-shape calculating apparatus 20 can acquire the mask pattern shape D3 according to a mask manufacturing simulation. Alternatively, the mask pattern shape D3 can be acquired by an actual mask manufacturing experiment. The mask-pattern-shape calculating apparatus 20 is a computer that predicts a plane shape of a mask pattern using the mask data D". The mask-pattern-shape calculating apparatus 20 calculates the mask pattern shape D3 based on a process condition or the like in the mask manufacturing process P1. The mask-pattern-shape calculating apparatus 20 calculates the mask pattern shape D3 using, for example, a calculation model for calculating the mask pattern shape D3 (S3). Specifically, the mask-pattern-shape calculating apparatus 20 models the evaluation value systematic distribution in the mask surface and further models a dimension conversion error based on a density difference of the mask pattern. The mask-pattern-shape calculating apparatus 20 applies the models to the mask data 2D to reproduce the evaluation value systematic distribution in the mask surface.

For example, the mask-pattern-shape calculating apparatus 20 calculates the mask pattern shape D3 according to a process simulation taking into account at least one of a systematic dimension distribution of the mask pattern caused when the mask pattern is formed and a dimension difference of the mask pattern depending on the density of the mask pattern.

The evaluation value systematic distribution of the mask pattern is often a distribution such as concentric circles or a tilt in the entire mask surface. Therefore, the evaluation value systematic distribution can be accurately reproduced by a combination of a surface formula and a polynomial. The density difference of the mask pattern has a correlation with a dimension value obtained by subjecting the influence from a near pattern to convolutional integration with Gaussian and an opening angle to an adjacent pattern. Therefore, the evaluation value systematic distribution can be accurately reproduced by a model using a function system of the dimension value and the opening angle.

On the other hand, when the mask pattern shape D3 is derived by an experiment, a mask is manufactured in the mask manufacturing process P1. Concerning the mask manufactured in the mask manufacturing process P1, various positions where evaluation values such as shape should be measured on the mask (mask patterns as measurement targets) are selected. Evaluation values of the selected mask patterns are measured by a scanning electron microscope (SEM), an optical measurement apparatus, an image acquiring apparatus, or the like. A diameter in a longitudinal direction, a diameter in a lateral direction, and the like of a contact hole are measured as a pattern shape of a contact hole pattern.

In this embodiment, two-dimensional shape parameters of the mask pattern are derived as the mask pattern shape D3. The two-dimensional shape parameters of the mask pattern are elements for determining a two-dimensional shape of the mask pattern viewed from a principal plane side of the mask and are, for example, an area, peripheral length, dimensions in the longitudinal direction and the lateral direction, and an aspect ratio.

After the mask pattern shape D3 in the mask surface is derived by the simulation or the experiment, an imaginary pattern shape (dimension) and an imaginary shape distribution on the wafer exposed with the same exposure in a shot on this mask are calculated.

Specifically, after the mask pattern shape D3 is derived, a mask-pattern-map creating apparatus 25 creates a mask pattern map m1 explained later (S4). The mask-pattern-map creating apparatus 25 is a computer that creates the mask pattern map m1 using the mask pattern shape D3. The mask pattern map m1 is a map (a distribution in shot) concerning the shapes of mask patterns in various positions in an exposure shot as an exposure target on the wafer. In the mask pattern map m1, information concerning a shape difference between the shape of the mask pattern formed on the mask in the mask manufacturing process P1 and the shape of an ideal mask pattern formed when a manufacturing error does not occur in mask manufacturing is stored.

After the mask pattern map m1 is created, an optical simulation is carried out using the mask pattern map m1 and a processing simulation is carried out to calculate an imaginary shape distribution (a shape distribution of a pattern after processing) on the wafer. The imaginary shape distribution (resist shape distribution) on the wafer can be calculated by only the optical simulation using the mask pattern map m1.

Specifically, a pattern-on-wafer-map calculating apparatus 30 calculates a pattern-on-wafer map m2 explained later (S5). The pattern-on-wafer-map calculating apparatus 30 is a computer that creates the pattern-on-wafer map m2 using the mask pattern map m1. The pattern-on-wafer-map calculating apparatus 30 calculates the pattern-on-wafer map m2 based on process conditions in a pattern forming process P2.

The pattern-on-wafer map m2 is a map (a distribution in shot) concerning plane shapes of patterns on wafer (resist patterns or post-etching patterns) in various positions in a shot. In the pattern-on-wafer map m2, information concerning a shape difference between the shape of a pattern on wafer formed on the wafer in the pattern forming process P2 and an ideal shape (a target shape, for example, a design layout) of a pattern on wafer formed when a formation error does not occur in the pattern on wafer formation is stored.

The pattern-on-wafer-map calculating apparatus 30 creates the pattern-on-wafer map m2 using, for example, a calculation model for calculating the pattern-on-wafer map m2. The calculation model for calculating the pattern-on-wafer map m2 is a model for converting the mask pattern map m1 into the pattern-on-wafer map m2 using, for example, a correspondence relation between an error (a deviation amount from an ideal value) of a pattern shape in the mask pattern map m1 and a pattern shape error of the pattern on wafer.

In the pattern forming process P2, a pattern on wafer (a resist pattern or a post-etching pattern) is formed on the wafer using the mask manufactured in the mask manufacturing process P1. In the pattern forming process P2, an exposure apparatus 60, an applying and developing apparatus 56, a processing apparatus 57, and the like are used.

The exposure apparatus 60 is an apparatus that performs exposure using the mask manufactured in the mask manufacturing process P1 to thereby transfer a mask pattern onto the wafer. The exposure apparatus 60 irradiates light emitted from a secondary light source on a mask and projects an image of a pattern formed on a mask onto the wafer via a projection optical system to expose the wafer.

The applying and developing apparatus 56 is an apparatus having functions same as those of the applying and developing apparatus 52. The applying and developing apparatus 56 has a function of applying a resist on the wafer before exposure processing by the exposure apparatus 60 is performed and a function of developing the resist on the exposed wafer and forming a resist pattern on the wafer. The processing apparatus 57 is an apparatus having functions same as those of the processing apparatus 53. The processing apparatus 57 performs base film processing such as etching from above the resist pattern on the wafer and forms a pattern such as a contact hole on the wafer.

In this way, in the pattern forming process P2, the exposure processing to the wafer is performed by the exposure apparatus 60. Therefore, when the exposure apparatus 60 is known in advance, the mask pattern map m2 can be calculated by an optical simulation taking into account a machine difference of the exposure apparatus 60. For example, at least one of optical parameters of the exposure apparatus 60 affecting a pattern on wafer shape such as an illumination shape, an illumination luminance distribution, the size of a lens, a degree of polarization, lens aberration, lens transmittance, polarization aberration, an exposure, focus offset, parallelism of scan of the mask and the wafer, a distribution of exposure wavelength, and a projection lens NA is incorporated into the optical simulation.

By incorporating the optical parameter in this way, it is possible to calculate an imaginary shape distribution into which not only an evaluation value systematic distribution on the mask but also an evaluation value systematic distribution due to the optical parameter of the exposure apparatus 60 is incorporated. This makes it possible to simultaneously correct shape errors indicated by the evaluation value systematic distributions due to both the mask and the exposure apparatus 60. Further, by carrying out the processing simulation, it is possible to correct shape errors indicated by evaluation value systematic distributions due to not only lithography but also a processing process.

The pattern-on-wafer map m2 can be calculated by a formation experiment of a pattern on wafer. In this case, the pattern on wafer is formed on the wafer in the pattern forming process P2. Pattern shapes in various positions (patterns on wafer as measurement targets) of the pattern on wafer formed in the pattern forming process P2 are measured by a SEM or the like. The pattern-on-wafer map m2 is a map (a distribution) of dimensions concerning pattern shapes on the wafer in various positions in a shot.

After the pattern-on-wafer map m2 is calculated, an exposure-map creating apparatus 40 creates an exposure map m3. The exposure-map creating apparatus 40 calculates the exposure map m3 for forming a pattern having a desired pattern shape on the wafer using the pattern-on-wafer map m2 (S6).

In other words, in this embodiment, a shape difference between an imaginary shape distribution on the wafer and a target shape is calculated in a shot in advance and a correction map of exposures is created such that the shape difference is smaller than a predetermined value. To correct the shape difference, a dimension fluctuation amount with respect to unit exposure fluctuation is specified in advance.

To form a pattern on wafer having a desired pattern shape, it is necessary to expose, in various positions in the shot, a resist on the wafer with an exposure corresponding to the positions (the pattern-on-wafer map 2). Therefore, the exposure map m3 is a map (a distribution in shot) of exposures (dosages) in the various positions in the shot. The exposure map m3 can be a map of exposure correction amounts in the various positions in the shot. After the exposure map m3 is created, the exposure map m3 is applied to the pattern forming process P2 and pattern formation is performed on the wafer.

For example, in the mask manufacturing process P1, in a process for manufacturing a mask, a pattern shape of a mask pattern formed on the mask deviates from a desired pattern shape. In the pattern forming process P2, a pattern shape of a pattern formed on the wafer deviates from a desired pattern shape because of systematic illumination shape deviation, illumination unevenness, aberration fluctuation, phase fluctuation of a lens, transmittance fluctuation, and the like in the shot caused by the illumination and the lens of the exposure apparatus 60. The pattern shape of the pattern formed on the wafer also deviates from the desired pattern shape because of systematic dimension fluctuation, phase fluctuation, transmittance fluctuation, and the like in the mask used in the exposure. The pattern shape of the pattern formed on the wafer also deviates from the desired pattern shape because of systematic fluctuation caused in the processing process.

In this embodiment, the exposure map m3 for correcting a deviation amount between the pattern-on-wafer map m2 and the target pattern shape of the pattern on wafer is created. Therefore, it is possible to correct, using the exposure map m3, a systematic dimension error in the shot on the wafer caused because of the mask manufacturing process P1 and the pattern forming process P2. Specifically, it is possible to correct, through exposure correction, dimension fluctuation on the wafer due to a mask dimension, shape, phase, transmittance, systematic optical parameter fluctuation in the shot of the exposure apparatus 60, systematic fluctuation in the shot caused in the processing process, and the like. The exposure map m3 can be a map of exposure correction amounts for correcting a deviation amount between the mask pattern map m1 and the target pattern shape of the pattern on wafer.

When a mask pattern is formed by uniformalized patterns (periodic patterns having the same shape) as in a memory product, a dimension change amount with respect to fluctuation in a unit exposure is substantially a fixed value. Therefore, when the mask pattern is the memory product, it is relatively easy to calculate a correction amount of an exposure for correcting a shape difference. However, in a system LSI product or the like, because mask patterns having various kinds of shapes are formed on the same mask, a dimension change amount with respect to fluctuation in a unit exposure is different for each of the mask patterns.

In such a case, it is possible to divide a mask surface into meshes of about several micrometers to several hundred micrometers and calculate an exposure correction amount for minimizing a deviation amount from an ideal value of a pattern on wafer in the meshes. Even when an exposure and a focus deviate, an exposure correction amount for minimizing a shape difference with respect to a target dimension (an exposure correction amount with large exposure margin) can be calculated. After the exposure correction amount is calculated for each of the divided meshes, exposure correction amounts of the meshes are joined to create the exposure map m3 in the mask surface.

Figure 2:
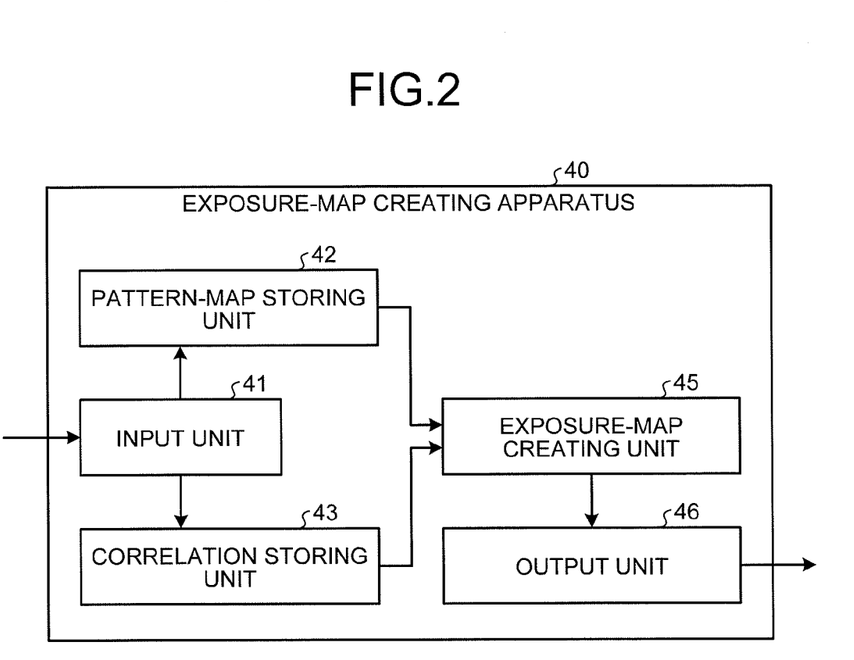
FIG. 2 is a block diagram of the configuration of an exposure-map creating apparatus according to the first embodiment.

FIG. 2 is a block diagram of the configuration of the exposure-map creating apparatus according to the embodiment. The exposure-map creating apparatus (an exposure determining apparatus) 40 includes an input unit 41, a pattern-map storing unit 42, a correlation storing unit 43, an exposure-map creating unit 45, and an output unit 46.

The input unit 41 receives input of the pattern-on-wafer map m2 from the pattern-on-wafer-map calculating apparatus 30 or the like. The input unit 41 receives input of correlation information indicating a correlation between an exposure correction amount (an optimum exposure correction amount B explained later) and an error amount (a plane shape difference D explained later) of a pattern shape (an area, etc.) on the wafer. The plane shape difference D is information indicating a difference concerning a shape between a pattern shape on the wafer calculated by a simulation or the like and a target shape of a pattern on wafer formed on the wafer. The correlation information is a mask error enhancement factor (MEF) (a ratio of a dimension fluctuation amount of the pattern on wafer with respect to a dimension fluctuation amount of the mask) concerning the area of a contact hole. The input unit 41 sends the pattern-on-wafer map m2 to the pattern-map storing unit 42 and sends the correlation information to the correlation storing unit 43.

The correlation information can be a correlation between the pattern shape on the wafer and a wafer exposure. The correlation information can also be a correlation between the plane shape difference D and the wafer exposure or can be a correlation between the pattern shape on the wafer and the optimum exposure correction amount B. The pattern-map storing unit 42 is a memory or the like that stores the pattern-on-wafer map m2. The correlation storing unit 43 is a memory or the like that stores the correlation information.

The exposure-map creating unit 45 creates the exposure map m3 using the pattern-on-wafer map m2 and the correlation information. The exposure map m3 is distribution information concerning an exposure in a shot in forming a pattern on wafer using the mask. For example, when the pattern on wafer calculated by a simulation or the like is larger than the target pattern in the plane shape difference D, the exposure is increased to reduce the pattern on wafer. When the pattern on wafer calculated by a simulation or the like is smaller than the target pattern, the exposure is reduced to increase the pattern on wafer.

The output unit 46 outputs the exposure map m3 created by the exposure-map creating unit 45. The exposure map m3 output from the output unit 46 is input to the exposure apparatus 60 and used in exposure processing to the wafer.

Figure 3:
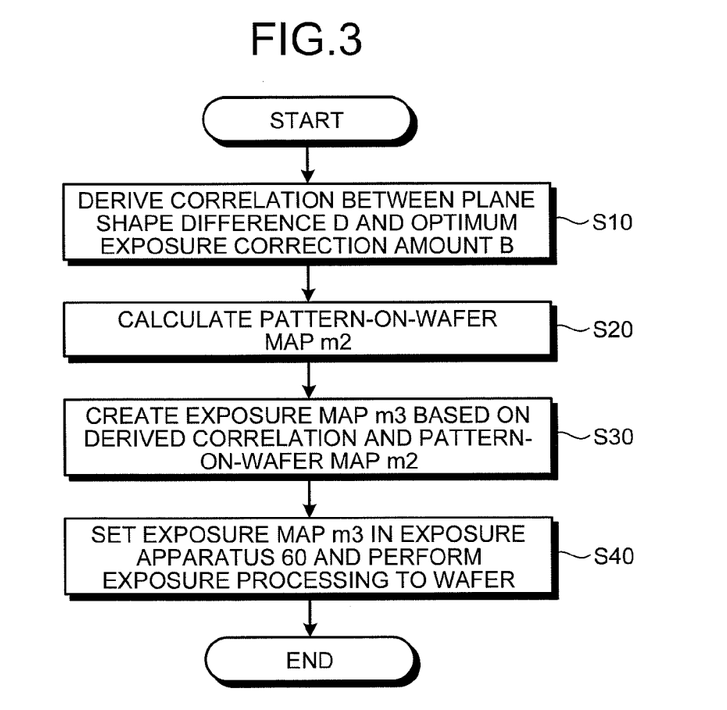
FIG. 3 is a flowchart for explaining an exposure processing procedure according to the first embodiment.

An exposure processing procedure according to the embodiment is explained. FIG. 3 is a flowchart for explaining the exposure processing procedure according to the first embodiment. First, the plane shape difference D as a shape difference between the pattern shape on the wafer calculated by a simulation or the like and the target shape of a pattern formed on the wafer is calculated for various patterns on wafers in advance. Further, an optimum exposure correction amount (the optimum exposure correction amount B) necessary for forming the patterns on wafer is calculated in advance. The plane shape difference D and the optimum exposure correction amount B can be calculated by a simulation or can be calculated by an experiment. Further, a correlation between the plane shape difference D and the optimum exposure correction amount B is derived as correlation information in advance (step S10). The correlation information is stored in the correlation storing unit 43.

After the correlation information is derived, the pattern-on-wafer-map calculating apparatus 30 calculates the pattern-on-wafer map m2 corresponding to the mask data D2 using the mask pattern map m1 (step S20). The calculated pattern-on-wafer map m2 is stored in the pattern-map storing unit 42.

The exposure-map creating unit 45 of the exposure-map creating apparatus 40 creates the exposure map m3 based on the correlation information in the correlation storing unit 43 and the pattern-on-wafer map m2 in the pattern-map storing unit 42 (step S30).

Figure 4:
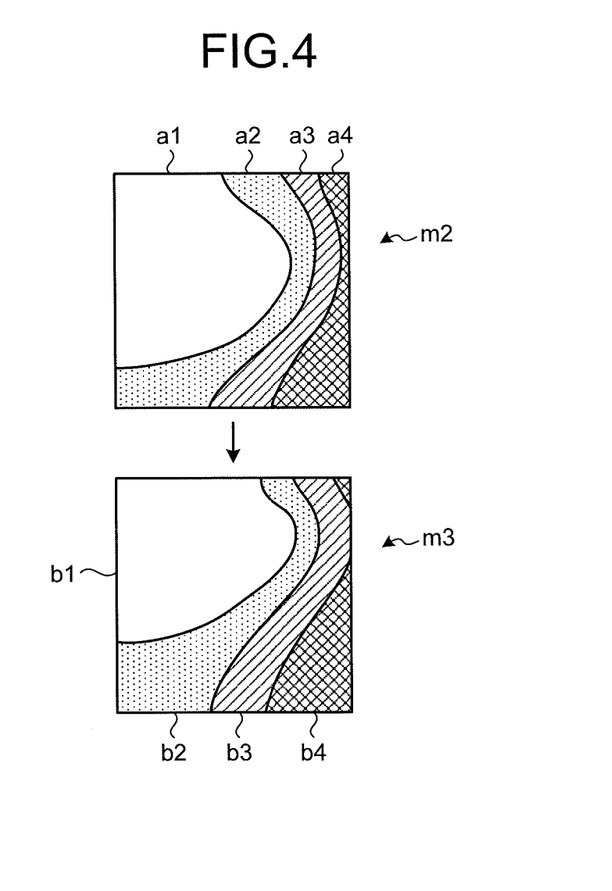
FIG. 4 is a diagram for explaining a relation between a pattern-on-wafer map and an exposure map.

FIG. 4 is a diagram for explaining a relation between the pattern-on-wafer map m2 and the exposure map m3. The pattern-on-wafer map m2 is a distribution in shot of shape errors of patterns on wafer. The exposure map m3 is a distribution in shot of the optimum exposure correction amount B. In FIG. 4, the distribution in shot of the pattern-on-wafer map m2 is regions a1 to a4 divided for each magnitude of the shape errors of the patterns on wafer. The distribution in shot of the exposure map m3 is regions b1 to b4 divided for each magnitude of the optimum exposure correction amount B. Because the pattern-on-wafer map m2 and the exposure map m3 have the correlation, the distribution in shot of the regions a1 to a4 and the distribution in shot of the regions b1 to b4 have substantially the same distributions.

The output unit 46 outputs the exposure map m3 created by the exposure-map creating unit 45. The exposure map m3 output from the output unit 46 is set in the exposure apparatus 60 and the exposure processing to the wafer is performed according to the exposure map m3 (step S40). This makes it possible to perform the exposure processing to the wafer with the optimum exposure correction amount B corresponding to the plane shape difference D, which is the shape error amount of the patterns on wafer.

As explained above, in this embodiment, contact hole patterns or the like are formed such that, rather than dimensions (CD), two-dimensional shape parameters such as an area, peripheral length, dimensions in the longitudinal direction and the lateral direction, and an aspect ratio are uniformalized on the wafer. Consequently, electric characteristics of the contact hole patterns uniformly approach a target value in a plane. Therefore, performance of a semiconductor device is stabilized and occurrence of defective products can be suppressed.

In this embodiment, the exposure map m3 is created based on the correlation between the plane shape difference D and the optimum exposure correction amount B. However, the exposure map m3 can be created based on a correlation between the plane shape difference D and the optimum exposure.

In this embodiment, the pattern-on-wafer map m2 is derived using the mask pattern map m1. However, when the pattern-on-wafer map m2 is derived by an experiment, the creation of the mask pattern map m1 can be omitted. In this case, for example, a correction amount of an exposure with respect to an exposure (which can be non-uniform) used in deriving the pattern-on-wafer map m2 is calculated.

As explained above, according to the first embodiment, an exposure correction amount and an exposure in a shot are determined based on the two-dimensional pattern shape stored in the pattern-on-wafer map m2. Therefore, it is possible to accurately determine an exposure correction amount and an exposure for enabling formation of a pattern having a desired two-dimensional shape parameter on the wafer.

A second embodiment of the present invention is explained with reference to FIGS. 5 to 8. In the second embodiment, an exposure correction amount is set based on an error of a mask pattern shape (the mask pattern map m1). In the following explanation, the exposure map m3 is derived using a correlation between the error of the mask pattern shape and an optimum exposure correction amount. However, the exposure map m3 can be derived using a correlation between the error of the mask pattern shape and an optimum exposure.

Figure 5:
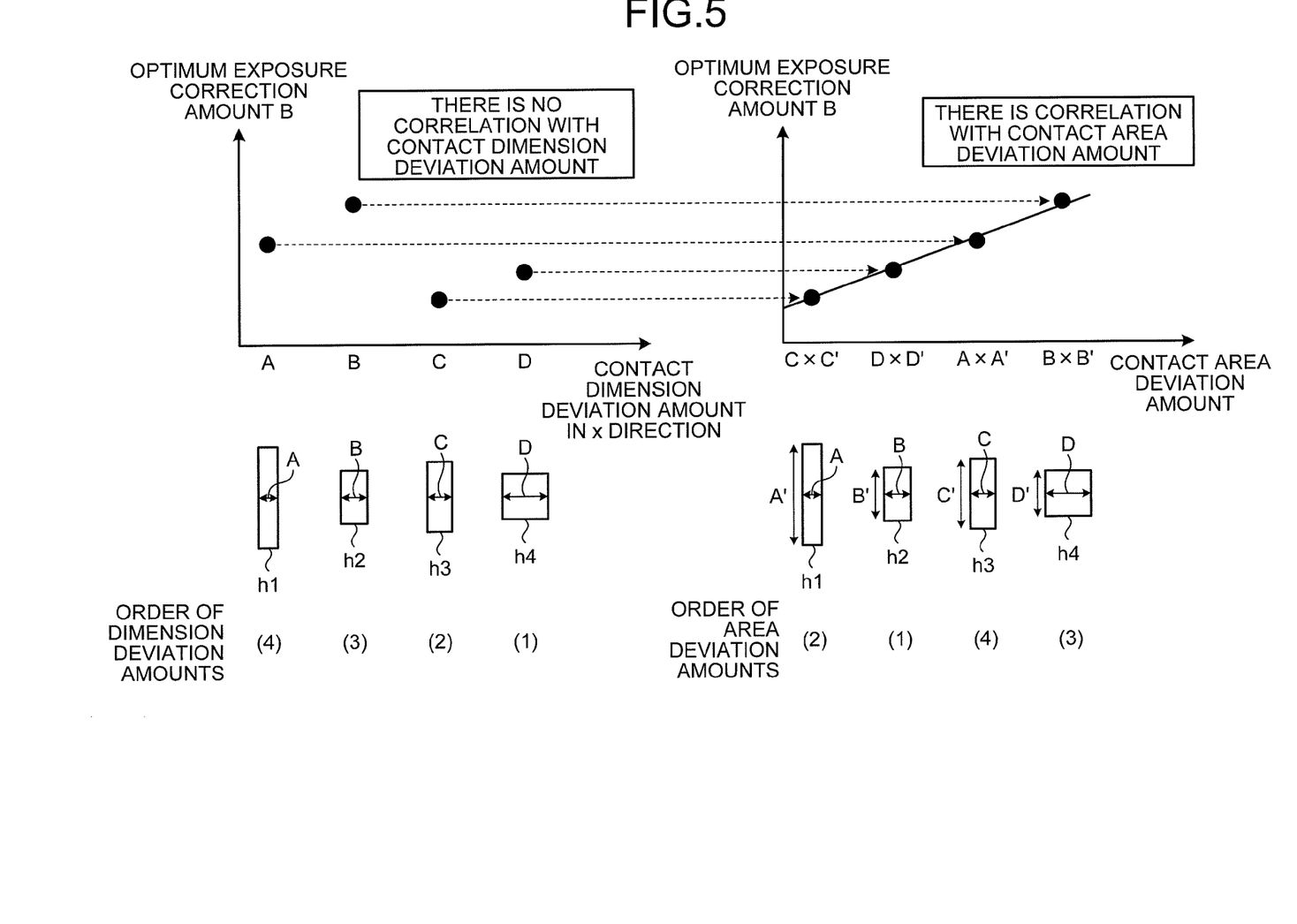
FIG. 5 is a diagram for explaining a correlation between an error of a mask pattern shape and an optimum exposure correction amount.

FIG. 5 is a diagram for explaining the correlation between the error of the mask pattern shape and the optimum exposure correction amount. Pattern dimensions in an x direction of contact holes h1 to h4 on the design data D1 are A to D, respectively, and pattern dimensions in a y direction are A' to D', respectively. Contact hole patterns are formed on a wafer using the contact holes h1 to h4, whereby not-shown contact hole patterns H1 to H4 are respectively formed as patterns on wafer corresponding to the shapes of the contact holes h1 to h4. At this point, a distribution of shape deviations occurs in a shot.

In FIG. 5, a correspondence relation between an error of a mask pattern shape and the optimum exposure correction amount B is shown. The correspondence relation is obtained when adjustment of an exposure is applied to a plurality of patterns having different mask pattern diameters such that the resist pattern diameters respectively have desired values. The correspondence relation between the error of the mask pattern shape and the optimum exposure correction amount B can be calculated by an experiment or can be calculated by an imaging simulation using the mask pattern shape.

On the upper left side of FIG. 5, a correspondence relation between dimension deviation amounts (contact dimension deviation amounts) in the x direction of the contact hole patterns H1 to H4 from a desired dimension and the optimum exposure correction amount B is shown. On the upper right side of FIG. 5, a correspondence relation between area deviation amounts (contact area deviation amounts) of the contact hole patterns H1 to H4 from a desired area is shown.

On the lower left side, the contact holes h1 to h4 and the order of magnitudes of contact dimension deviation amounts of the contact hole patterns H1 to H4 are shown in association with each other. On the lower right side of FIG. 5, the contact holes h1 to h4 and the order of magnitudes of contact area deviation amounts of the contact hole patterns H1 to H4 are shown in association with each other.

When a mask pattern shape is a contact hole, as shown on the left side of FIG. 5, there is no correlation between contact dimension deviation amounts in one direction (e.g., the x direction) of the contact holes H1 to H4 and the optimum exposure correction amount B. For example, even when the order of magnitudes of the contact dimension deviation amounts of the contact hole patterns H1 to H4 is the contact hole h4, the contact hole h3, the contact hole h2, and the contact hole h1, the magnitudes of the optimum exposure correction amount B are not always in this order.

Figure 6:
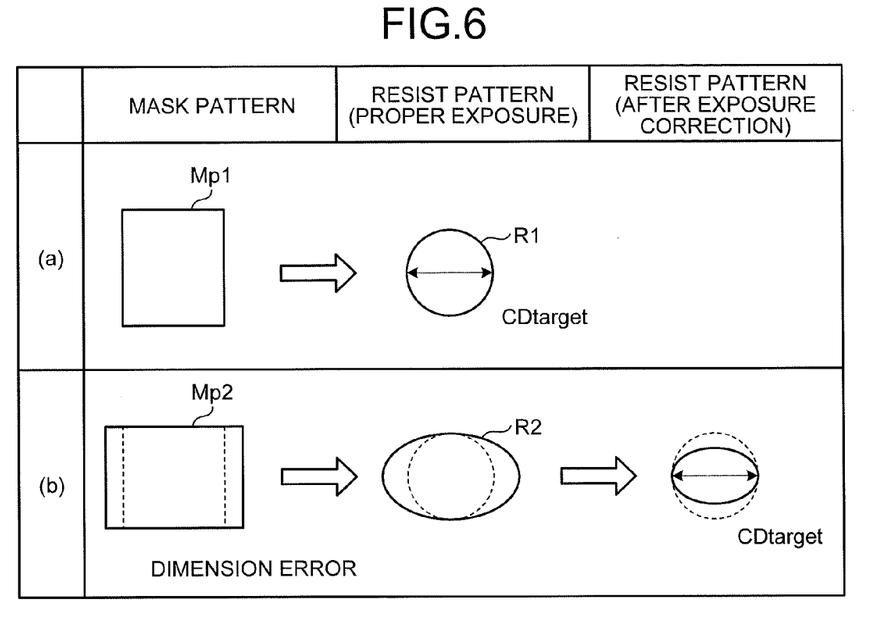
FIG. 6 is a diagram for explaining problems that occur when a target is corrected based on a dimension only in one direction.

FIG. 6 is a diagram for explaining problems that occur when a target is corrected based on a dimension only in one direction. As shown in (a) of FIG. 6, when the exposure processing is applied, with a standard exposure (a proper exposure without correction), to an ideal mask pattern Mp1 without a manufacturing error or the like, a resist pattern R1 corresponding to a desired dimension target is formed.

On the other hand, as shown in (b) of FIG. 6, when the exposure processing is applied to a mask pattern Mp2 having a dimension error with the standard exposure, a resist pattern R2 with a shape deviating due to the dimension error is formed. For example, when the mask pattern Mp2 is enlarged in the lateral direction because of a manufacturing error or the like, the resist pattern R2 is also formed to be enlarged in the lateral direction. In such a case, if an exposure is corrected such that a dimension in the lateral direction is equal to a desired dimension target, a resist pattern R3 after the exposure correction is small in a dimension in the longitudinal direction. Therefore, if a resist pattern is formed on a substrate using such an exposure correction amount, the resist pattern is formed at a desired dimension only in the lateral direction and cannot be formed at the desired dimension in the longitudinal direction. This is because the optimum exposure correction amount B necessary in forming a resist pattern of a contact hole on the wafer is a value corresponding to the shape of a contact hole pattern to be formed and is not a value corresponding to only a dimension in the x direction of the contact hole pattern to be formed. Therefore, even if a wafer exposure correction amount is set based on the direction in the x direction of a pattern on wafer and a target dimension in the x direction, a desired pattern on wafer cannot be formed.

In this way, when the mask pattern has an anisotropic dimension error, if the diameter of the resist pattern of the contact hole is adjusted to the target dimension by adjusting the exposure correction amount, the area of the contact hole pattern deviates from a target area. In the semiconductor device, the contact hole pattern plays a role of electrically connecting wires of an upper layer and a lower layer. Therefore, if the sectional area of the contact hole pattern deviates from the target area, the electric resistance of the contact hole pattern also deviates. As a result, the operation characteristic of the semiconductor device is adversely affected.

As shown on the upper right side of FIG. 5, there is a correlation between contact area deviation amounts of the contact hole patterns H1 to H4 and the optimum exposure correction amount B. For example, when the order of the magnitudes of the contact area deviation amounts of the contact holes h1 to h4 is the contact hole h3 (an area is C×C'), the contact hole h4 (an area is D×D'), the contact hole h1 (an area is A×A'), and the contact hole h2 (an area is B×B'), the magnitudes of the optimum exposure correction amount B is also in this order. Therefore, by setting the optimum exposure correction amount B based on a deviation amount of a two-dimensional shape (an area, etc.) of the mask pattern, it is possible to form a pattern having a desired shape on the wafer. In this way, in this embodiment, the contact hole patterns or the like are formed such that, rather than dimensions (CD), areas and the like are uniformalized on the wafer. Consequently, electric characteristics of the contact hole patterns uniformly approach a target value in a plane. Therefore, performance of the semiconductor device is stabilized and occurrence of defective products can be suppressed.

Figure 7:
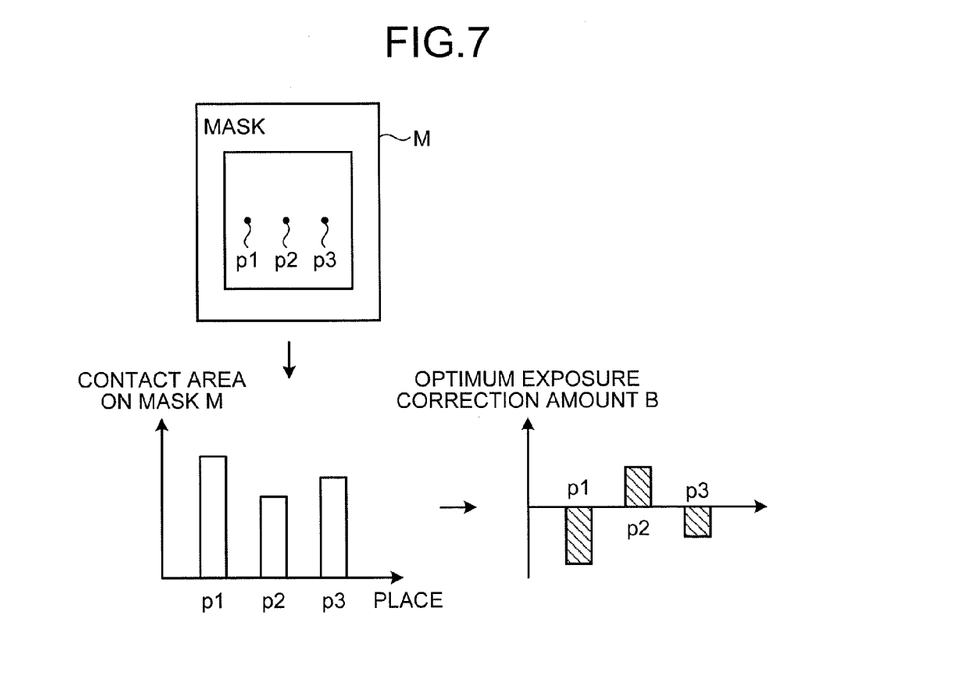
FIG. 7 is a diagram for explaining processing for setting an exposure correction amount corresponding to a mask pattern shape.

FIG. 7 is a diagram for explaining setting processing for an exposure correction amount corresponding to a mask pattern shape. Mask patterns (contact hole patterns) having various shape errors corresponding to the mask manufacturing process P1 are formed in a mask M. Because, for example, contact hole patterns formed in positions p1 to p3 in the mask M cause various shape errors according to the mask manufacturing process P1, contact areas on the mask M of the contact hole patterns also cause various errors. Therefore, the exposure-map creating apparatus 40 (the exposure determining apparatus) sets, to eliminate the errors of the contact areas, an exposure correction amount for each of the positions p1 to p3 to thereby create the exposure map m3.

Figure 8:
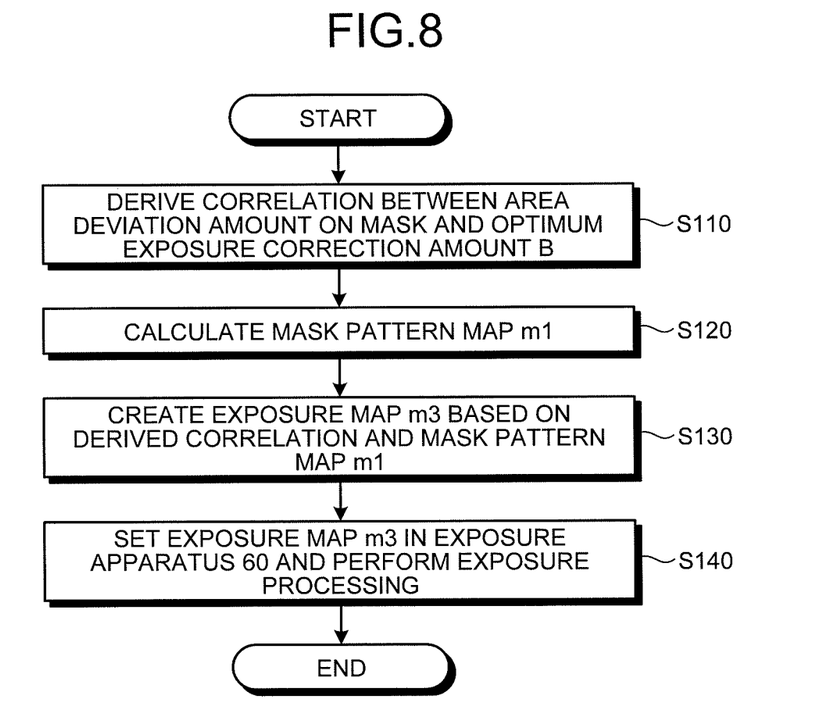
FIG. 8 is a flowchart for explaining an exposure processing procedure according to a second embodiment.

An exposure processing procedure according to the second embodiment is explained below. FIG. 8 is a flowchart for explaining the exposure processing procedure according to the second embodiment. In the processing procedure shown in FIG. 8, redundant explanation of processing same as the processing procedure shown in FIG. 3 is omitted.

First, a correlation between a contact area deviation amount on a mask calculated by a simulation, an experiment, or the like and the optimum exposure correction amount B is derived as correlation information in advance (step S10). The correlation information is derived by repeating the simulation and the experiment to calculate an optimum exposure in advance and setting a correlation between the contact area deviation amount and the optimum exposure as a rule or a model function. Specifically, a shape difference between a pattern shape on the mask calculated by the simulation, the experiment, or the like, a target shape of a pattern formed on the wafer is calculated for various patterns on mask in advance. Further, an optimum exposure correction amount necessary for forming patterns on wafer (the optimum exposure correction amount B) is calculated in advance. A correlation between the shape difference and the optimum exposure correction amount B is derived as correlation information. The correlation information is stored in the correlation storing unit 43.

After the correlation information between the contact area deviation amount and the optimum exposure correction amount B is derived, the mask-pattern-map creating apparatus 25 creates the mask pattern map m1 using the mask pattern shape D3 (step S120). The created mask pattern map m1 is stored in the pattern-map storing unit 42.

The exposure-map creating unit 45 of the exposure-map creating apparatus 40 creates the exposure map m3 based on the correlation information in the correlation storing unit 43 and the mask pattern map m1 in the pattern-map storing unit 42 (step S130).

The output unit 46 outputs the exposure map m3 created by the exposure-map creating unit 45. The exposure map m3 output from the output unit 46 is set in the exposure apparatus 60 and exposure processing to the wafer is performed according to the exposure map m3 (step S140). This makes it possible to perform the exposure processing to the wafer with the optimum exposure correction amount B corresponding to the contact area deviation amount, which is an error amount of the mask pattern shape.

Adjustment of the exposure correction amount using the exposure map m3 is performed, for example, for each layer or for each mask in a wafer process. A semiconductor device (a semiconductor integrated circuit) is manufactured using the exposure map m3 corresponding to each layer or each mask. Specifically, the exposure map m3 is created for each layer or each mask in the wafer process. The exposure processing is performed using the exposure map m3 and, thereafter, development processing, etching processing, and the like for the wafer are performed. When the semiconductor device is manufactured, the creation processing for the exposure map m3, the exposure processing, the development processing, the etching processing, and the like are repeated for each layer.

Figure 9:
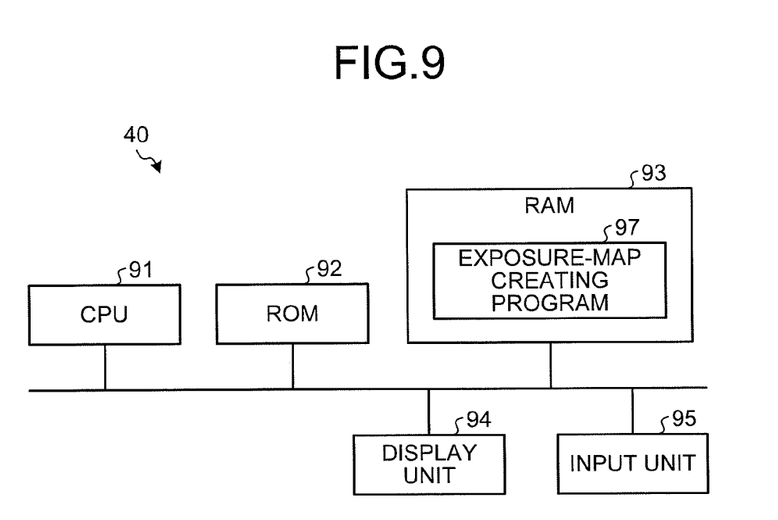
FIG. 9 is a diagram of a hardware configuration of an exposure-map creating apparatus.

A hardware configuration of the exposure-map creating apparatus 40 is explained below. FIG. 9 is a diagram of a hardware configuration of the exposure-map creating apparatus. The exposure-map creating apparatus 40 includes a central processing unit (CPU) 91, a read only memory (ROM) 92, a random access memory (RAM) 93, a display unit 94, and an input unit 95. In the exposure-map creating apparatus 40, the CPU 91, the ROM 92, the RAM 93, the display unit 94, and the input unit 95 are connected via a bus line.

The CPU 91 creates the exposure map m3 using an exposure-map creating program (an exposure determining program) 97, which is a computer program for creating the exposure map m3. The display unit 94 is a display device such as a liquid crystal monitor. The display unit 94 displays, based on an instruction from the CPU 91, the pattern-on-wafer map m2, a correlation between the optimum exposure correction amount B and the plane shape difference D, a correlation between the contact area deviation amount and the optimum exposure correction amount B, the exposure map m3, and the like. The input unit 95 includes a mouse and a keyboard. The input unit 95 receives input of instruction information (parameters necessary for creation of an exposure map, etc.) externally input from a user. The instruction information input to the input unit 95 is sent to the CPU 91.

The exposure-map creating program 97 is stored in the ROM 92 and loaded into the RAM 93 via the bus line. In FIG. 9, a state in which the exposure-map creating program 97 is loaded into the RAM 93 is shown.

The CPU 91 executes the exposure-map creating program 97 loaded into the RAM 93. Specifically, in the exposure-map creating apparatus 40, according to an instruction input from the input unit 95 by the user, the CPU 91 reads out the exposure-map creating program 97 from the ROM 92, expands the exposure-map creating program 97 in a program storage region in the RAM 93, and executes various kinds of processing. The CPU 91 causes a data storage region formed in the RAM 93 to temporarily store various data generated in the various kinds of processing.

The exposure-map creating program 97 executed by the exposure-map creating apparatus 40 has a module configuration including the units such as the exposure-map creating unit 45. The units are loaded onto a main storage and generated on the main storage.

Figure 10:
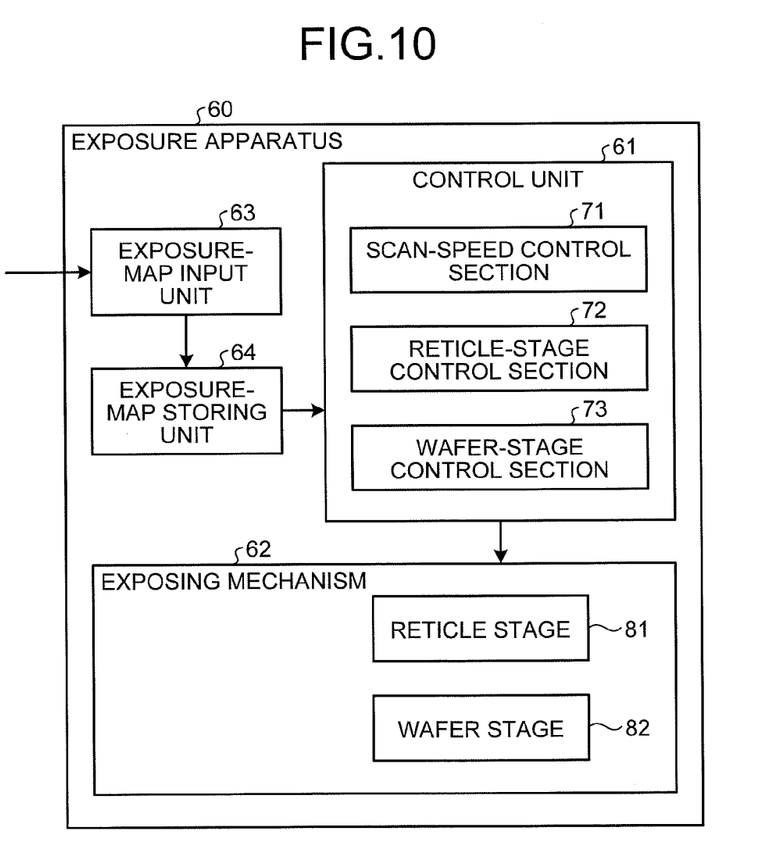
FIG. 10 is a block diagram of the configuration of an exposure apparatus.

The configuration of the exposure apparatus 60 is explained below. FIG. 10 is a block diagram of the configuration of the exposure apparatus. The exposure apparatus 60 is, for example, an exposure apparatus of a step and scan system that synchronously scans a reticle and a wafer with respect to a projection optical system to perform exposure. The exposure apparatus 60 changes scan speed (moving speed) of a reticle stage and a wafer stage to thereby control an exposure distribution in a shot. The exposure apparatus 60 includes a control unit 61, an exposing mechanism 62, an exposure-map input unit 63, and an exposure-map storing unit 64.

The exposure-map input unit 63 receives input of the exposure map m3 from an external apparatus or the like. The exposure-map creating apparatus 40 (the exposure determining apparatus) can be mounted on the inside of the exposure apparatus 60. In this case, the exposure map m3 is created on the inside of the exposure apparatus. The exposure-map storing unit 64 is a memory or the like that stores the exposure map m3. The control unit 61 has a function of controlling the exposing mechanism 62 using the exposure map m3 and includes a scan-speed control section 71, a reticle-stage control section 72, and a wafer-stage control section 73.

The scan-speed control section 71 adjusts scan speed in a shot such that the inside of the shot is exposed in an exposure distribution corresponding to the exposure map m3. The reticle-stage control section 72 controls a moving direction or the like of the reticle stage. The wafer-stage control section 73 controls a moving direction or the like of the wafer stage.

The exposing mechanism 62 has a function of performing exposure processing to a wafer according to an instruction from the control unit 61 and includes a reticle stage 81 and a wafer stage 82. A reticle (a mask) is placed on the reticle stage 81. The reticle stage 81 moves the reticle in an XY plane according to an instruction from the reticle-stage control section 72. A wafer is placed on the wafer stage 82. The wafer stage 82 moves the wafer in the XY plane according to an instruction from the wafer-stage control section 73.

When the exposure apparatus 60 does not perform correction of an exposure, the exposure apparatus 60 performs exposure in a state in which predetermined speed is maintained in a position of an exposure area. At this point, the reticle stage 81 and the wafer stage 82 are moved in a synchronized state according to an instruction from the control unit 61 to move in directions opposite to each other.

When the exposure apparatus 60 performs the correction of an exposure, the control unit 61 controls an exposure in a shot by changing scan speed while maintaining a moving amount ratio and a ratio of scan speeds of the reticle stage 81 and the wafer stage 82. Specifically, the control unit 61 controls the scan speeds of the reticle stage 81 and the wafer stage 82 to obtain an exposure distribution corresponding to the exposure map m3.

In this embodiment, the exposure map m3 for correcting a deviation amount between the pattern-on-wafer map m2 and a target pattern shape is created. Therefore, it is possible to correct, with the exposure map m3, a systematic dimension error in a shot on the wafer caused by the mask manufacturing process P1 and the pattern forming process P2. It is possible to correct, by performing the exposure processing using the exposure map m3, dimension fluctuation on the wafer due to systematic fluctuation in a mask surface and systematic fluctuation in optical parameters in a shot during exposure. In other words, because a dimension error caused by systematic fluctuation can be reduced by using the exposure map m3, it is possible to relax specifications of systematic fluctuation that can be allowed in the process units.

Therefore, it is possible to reduce dimension fluctuation on the wafer due to systematic evaluation value fluctuation on the mask. As a result, it is possible to substantially improve dimension uniformity on the wafer. It is confirmed that, by using the exposing method according to this embodiment, dimension accuracy in a shot is improved by percentage as high as about 20% compared with the exposing method in the past.

In the first and second embodiments, the optimum exposure correction amount B is determined based on a pattern shape of a mask pattern or a pattern on wafer. However, the optimum exposure correction amount B can be determined based on a pattern dimension of the mask pattern or the pattern on wafer. In this case, the pattern dimension of the mask pattern is calculated by a mask manufacturing simulation using the mask data D2 in advance. The pattern dimension of the pattern on wafer is calculated by an optical simulation or a processing simulation using the mask pattern shape D3 in advance.

According to the second embodiment, an exposure correction amount or an exposure in a shot is determined based on a two-dimensional pattern shape stored in the mask pattern map m1. Therefore, it is possible to accurately determine an exposure correction amount or an exposure for enabling formation of a pattern having a desired two-dimensional shape parameter on the wafer.

A pattern dimension is calculated by the mask manufacturing simulation, the optical simulation, or the processing simulation and the optimum exposure correction amount B is determined based on the calculated pattern dimension. Therefore, it is possible to accurately determine an exposure correction amount for enabling formation of a pattern having a desired dimension on the wafer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device comprising:
    acquiring, as a mask pattern map, a deviation amount distribution of a two-dimensional shape parameter between a mask pattern formed on a mask and a desired mask pattern;
    determining, such that a deviation amount of the two-dimensional shape parameter between a pattern on substrate formed when the mask is subjected to exposure shot to form a pattern on a substrate and a desired pattern on substrate fits within a predetermined range, an exposure for each position in the exposure shot in forming the pattern on substrate based on the mask pattern map; and
    exposing the mask based on the determined exposure to form a pattern on the substrate.

2. The method of manufacturing a semiconductor device according to claim 1, wherein the two-dimensional shape parameter includes at least one of an area, peripheral length, dimensions in a longitudinal direction and a lateral direction, and an aspect ratio of the pattern.

3. The method of manufacturing a semiconductor device according to claim 1, wherein
    the mask pattern map is calculated by a process simulation for calculating a shape of the mask pattern formed on the mask using mask data of the mask, and
    the process simulation is a simulation that takes into account at least one of a systematic dimension distribution of a mask pattern in the shot caused in forming the mask pattern and a dimension difference of the mask pattern depending on density of the mask pattern.

* * * * *